United States Patent
Skärby

(10) Patent No.: US 6,334,050 B1
(45) Date of Patent: Dec. 25, 2001

(54) ARRANGEMENT AND A METHOD RELATING TO A RADIO UNIT

(75) Inventor: Ulf Bertil Christian Skärby, Lidingö (SE)

(73) Assignee: Telefonaktiebolaget LM Ericsson (publ), Stockholm (SE)

(*) Notice: Subject to any disclaimer, the term of this patent is extended or adjusted under 35 U.S.C. 154(b) by 0 days.

(21) Appl. No.: 09/095,942

(22) Filed: Jun. 12, 1998

(30) Foreign Application Priority Data

Jun. 13, 1997 (SE) .................................................. 9702272

(51) Int. Cl.$^7$ ............................ H04B 1/04; H04B 17/00; H04B 7/00; H04B 1/06
(52) U.S. Cl. ..................... 455/126; 455/115; 455/67.1; 455/234.1
(58) Field of Search ........................... 455/126, 103, 455/115, 234.1, 237.1, 241.1, 245.1, 249.1, 253.2, 14, 127

(56) References Cited

U.S. PATENT DOCUMENTS

| | | | |
|---|---|---|---|
| 5,335,369 | * | 8/1994 | Aisaka ................................. 455/116 |
| 5,459,426 | * | 10/1995 | Hori ................................. 455/126 X |
| 5,524,287 | * | 6/1996 | Yokoya et al. ...................... 455/115 |
| 5,566,363 | | 10/1996 | Senda ................................. 455/126 |
| 5,574,993 | * | 11/1996 | Kobayashi et al. ................... 455/126 |
| 5,603,106 | * | 2/1997 | Toda ................................. 455/126 |
| 5,715,527 | * | 2/1998 | Horii et al. .......................... 455/126 |
| 5,805,979 | * | 9/1998 | Miyashita .......................... 455/234.1 |
| 5,912,641 | * | 6/1999 | Dietrich .............................. 342/354 |
| 6,005,884 | * | 12/1999 | Cook et al. ...................... 455/67.1 X |
| 6,038,428 | * | 3/2000 | Mizusawa et al. ................... 455/126 |
| 6,038,432 | * | 3/2000 | Onoda ................................. 455/126 |

FOREIGN PATENT DOCUMENTS

| | | |
|---|---|---|
| 0 654 898 | 5/1995 | (EP) . |
| 0 684 707 | 11/1995 | (EP) . |
| 0 695 031 | 1/1996 | (EP) . |
| A7-250020 | 9/1995 | (JP) . |
| WO95/15037 | 6/1995 | (WO) . |
| WO96/27242 | 9/1996 | (WO) . |

* cited by examiner

*Primary Examiner*—Tracy Legree
(74) *Attorney, Agent, or Firm*—Burns, Doane, Swecker & Mathis, L.L.P.

(57) ABSTRACT

An arrangement for controlling and adjusting the output power of radio frequency signals sent from a radio unit (100) and the input power of radio frequency signals received by the radio unit. Variations in the amplification/attenuation of transmitter-and-receiver units are simultaneously compensated for in both the transmitter part and the receiver part of the units so that the amplification will remain the same irrespective of these variations in operation. A detector signal ($U_{det}$) is compared with a reference signal ($U_{ref}$) by a difference amplifier (112), which generates a difference signal ($U_e$). The detector signal ($U_{det}$) is measured by a power sensing means provided in the vicinity of an antenna (113), and corresponds to the power at which radio frequency signals are transmitted. The reference signal ($U_{ref}$) corresponds to a desired power of transmitted radio frequency signals. The difference signal ($U_e$) generated by the difference amplifier (112) controls the setting of the amplification of a first variable amplifier (109) and a second variable amplifier (110), adapted to amplify radio frequency signals that are transmitted and received respectively.

25 Claims, 6 Drawing Sheets

# ARRANGEMENT AND A METHOD RELATING TO A RADIO UNIT

FIELD OF INVENTION

The present invention relates to an arrangement and to a method for controlling the output power of radio frequency signals sent from a radio unit in a radio base station (RBS) and the input power of radio frequency signals received by the radio unit. The arrangement is particularly designed to control the output power from radio base stations that include remote amplifier stages.

BACKGROUND OF THE INVENTION

The majority of countries have mobile radio systems. In order to enable the system operators to satisfy capacity expectations with the frequency bands allotted to the Operator, the mobile radio system is divided into geographical areas that are called cells. The cells may have a radio base station placed in the centre of the cell, wherein a mobile terminal communicates with other mobile terminals and with a land-based telephone network through said radio base station. The cells are designated omnicells in this latter case. One and the same radio base station can cover several cells with the aid of directional antennas, these cells then being designated sector cells.

Radio channels that are allotted to the mobile radio system are shared by those cells that are included in the system. A set of mutually the same radio channels can be used in several cells. Cells that use the same radio channels are spaced sufficiently apart so as not to interfere with one another. This demands careful cell planning.

First-time planning of a cell involves choosing the respective positions of radio base stations and antennas, among other things. The power at which the antennas are permitted to transmit is governed by the positions of the radio base stations and the antennas, which in turn governs the area covered by the base stations. Improvements in capacity, for instance, necessitates the cells being made smaller and therewith the maximum permitted output power to be reduced.

In order to plan a cell accurately and, at the same time, provide the highest possible output power without exceeding a permitted power level, it is necessary to control the power output of the antenna both accurately and quickly.

EP 0684707 A1 teaches an arrangement and a method for controlling the transmission power of radio frequency signals. A power-sensitive element placed within an antenna element enables the transmission power of radio frequency signals to be monitored. The signal power measured by the power sensitive element is converted analogue/digital and delivered to a microprocessor. The microprocessor generates an output signal in relation to said input signal, said output signal controlling a variable attenuator included in the transmitter chain of the arrangement and thus influencing the output power of radio frequency signals by virtue of different attenuation levels of the attenuator. The power control is carried out with each time slot and the power of a transmitted radio frequency signal is not changed during a time slot but is adjusted between time slots.

EP 0695031 A2 teaches a mobile communications arrangement that includes a control circuit for adjusting, or setting, the output power of radio frequency signals. A reference voltage generator generates a reference voltage that is compared with a detected voltage by means of a comparator. The voltage detected corresponds to a power of a radio frequency signal to be transmitted. The detected voltage is obtained by measuring the power of the radio frequency signal with an output power sensor and converting the measured power to a corresponding detected voltage with a detector. The reference voltage corresponds to a desired output power of the radio frequency signal. The comparator generates a difference signal, i.e. a signal corresponding to the difference between the measured power and the reference power, which controls a power amplifier in the transmitter link of the arrangement. The control circuit sets the amplification factor of the power amplifier so that the output power of the radio frequency signal will correspond to the desired output power. Generated reference voltages derive from measurements of received radio frequency signals and the reference voltages are thus dependent on the received radio frequency signals.

Described in JP 07250020 A is a regulator intended for controlling output powers of radio frequency signals that shall be transmitted from a portable telephone or like apparatus. According to this solution, when measuring the power at which radio frequency signals are transmitted, there is used an antenna which receives a part of those radio frequency signals that are sent by the portable telephone. Received radio frequency signals are detected and compared with a d.c. voltage in a comparator and the difference indicating signal generated thereby controls indirectly a variable amplifier in the transmitter link of the portable telephone.

SUMMARY OF THE INVENTION

The present invention addresses the problem of how earlier determined amplification factors (gain) can be set with good tolerance for transmitters and receivers in a radio unit irrespective of ambient temperature, even when a long feeder is used between a transmitter-and-receiver unit and a remote amplifier stage.

Another problem solved by the present invention is one of guaranteeing a maximum output power of radio frequency signals sent from the radio unit.

Another problem addressed by the present invention is one of eliminating the need of manually trimming maximum transmitted power from an antenna arranged at the radio unit, and manually trimming the amplification of the receiver link in the radio unit upon installation.

Thus, an object of the present invention is to set earlier specified amplification factors (gain) with good tolerance for the transmitter and the receiver of the radio unit.

Another object of the present invention is to guarantee a maximum output power of radio frequency signals sent from the radio unit.

Still another object of the invention is to eliminate the need of trimming-in the radio unit manually upon installation.

The above problems are solved in accordance with the present invention, by providing a power sensing means in the vicinity of an antenna at a radio base station. The power sensing means converts transmitted radio frequency signals to a detector voltage corresponding to the radio signal. The detector voltage is compared with a reference voltage in a difference amplifier. The reference voltage is generated in the radio base station and corresponds to a desired maximum output power of transmitted radio frequency signals. The difference amplifier generates a difference signal which is used to set the amplification of a first variable amplifier in the transmitter, link in one embodiment of the invention, and also of a second variable amplifier in the receiver link.

One advantage afforded by the present invention is that it compensates automatically for the temperature dependency of all components in the transmitter link with the exception of the difference amplifier.

Another advantage is that the amplification of the transmitter and of the receiver (gain) can be set simultaneously with one and the same control circuit.

A further advantage afforded by the present invention is that the amplification in the transmitter link and in the receiver link is independent of the attenuation in a feeder provided in a radio base station between a transmitter-and-receiver unit and a remote amplification stage.

Yet another advantage afforded by the invention is that it eliminates the need to trim the output power manually when installing the radio base station.

The present invention will now be described in more detail with reference to preferred embodiments thereof and also with reference to the accompanying drawings.

DESCRIPTION OF PREFERRED EMBODIMENTS

Figure 1:
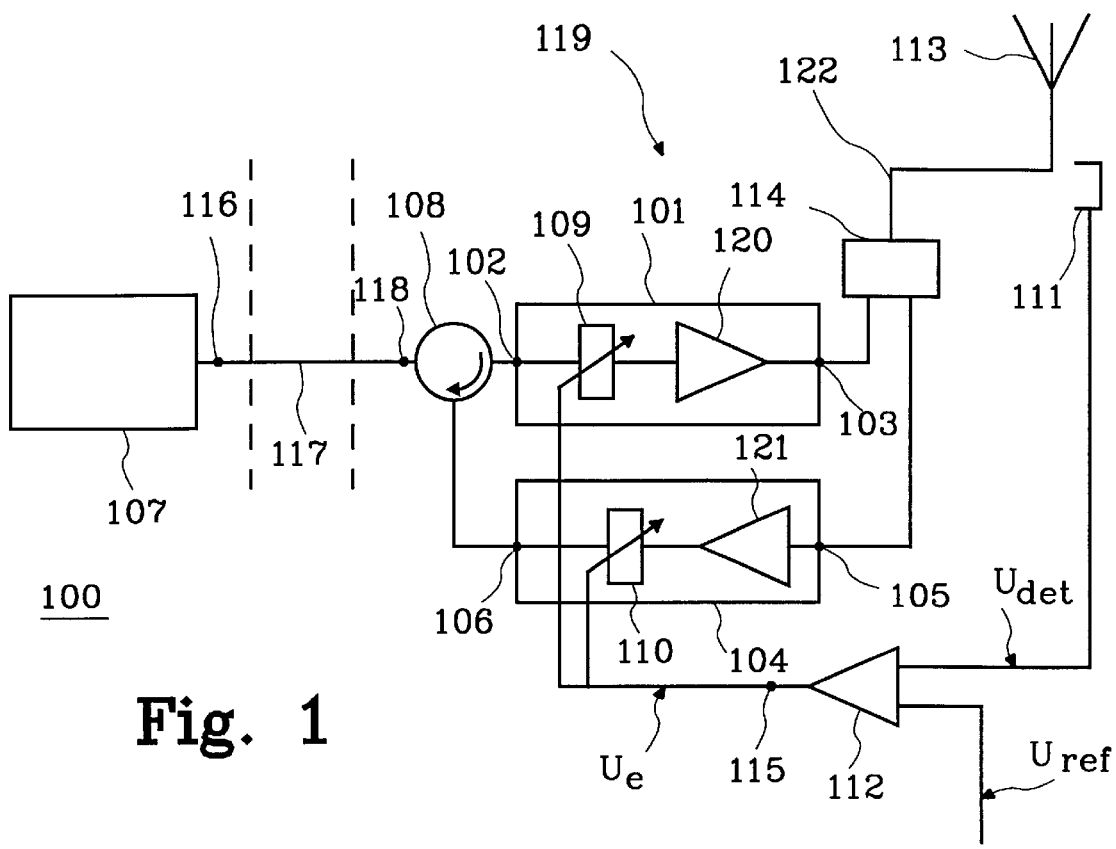
FIG. 1 illustrates an embodiment of an inventive radio unit.

FIG. 1 shows a radio unit 100 which forms part of a radio base station. The radio unit 100 includes a transmitter-and-receiver unit 107 in which essentially all signal processing for the radio base station is carried out. Radio frequency signals generated by the transmitter part of the transmitter-and-receiver unit 107 occur on a transmitter-and-receiver unit connection 116. The generated radio frequency signals are fed by a feeder 117 to a connection 118 on an antenna unit 119 carried on the top of a mast. A circulator 108 connects the generated radio signals with an input 102 of a remote transmitter amplifier unit 101. In another embodiment, the circulator 108 may be replaced with a duplex filter that functions in accordance with the same principles as the circulator 108. The remote transmitter amplifier unit 101 includes a first variable amplifier 109 and a power amplifier 120. The first variable amplifier 109 may be comprised of a fixed attenuator pad, but is referred to as an amplifier hereinafter. The radio frequency signals arriving on the input 102 of the remote transmitter amplifier unit are amplified to a determined level by the remote transmitter amplifier unit 101 and are delivered on an output 103 of said remote transmitter amplifier unit 101. The radio frequency signals generated on the output 103 are delivered to an antenna 113 via a duplex filter 114.

Radio frequency signals received by the antenna 113 are delivered to an input 105 of a remote receiver amplifier unit 104 via the duplex filter 114. Received radio frequency signals that occur over the input 105 of the remote receiver amplifier unit 105 are amplified to a determined level and delivered to an output 106 of the remote receiver amplifier unit 104. The remote receiver amplifier unit 104 includes an amplifier 121, for instance a low noise amplifier, and a second variable amplifier 110. The radio frequency signals arriving on the output 106 of the remote receiver amplifier unit 104 are delivered to the transmitter-and-receiver unit 107 via the circulator 108 and the feeder 117. All detection of the received radio frequency signal is carried out in the receiver part of the transmitter-and-receiver unit 107.

It is not necessary to use one and the same antenna for transmission and reception, and separate antennas can be used to this end. In this latter case, the power sensing means (111) will be arranged in the proximity of the antenna intended for transmission.

The power of transmitted radio frequency signals must be limited so as not to interfere with other radio frequency signals of the same frequencies that are reused in a cellular radio system, among other things. There is also found a permitted maximum power that may not be exceeded for transmitting radio frequency signals in a cellular system. This maximum power is determined nationally. Both the limiting and the control of transmission powers are effected with the aid of a control circuit in the antenna unit 119.

The control circuit includes a power sensing means 111, a signal difference amplifier 112 that includes a peakhold detector and an amplifier, the first variable amplifier 109. The magnitude of the power of a transmitted radio frequency signal is determined by the magnitude of a reference signal $U_{ref}$.

The power sensing means 111 converts the power value of a measured radio frequency signal to a detector signal $U_{det}$ corresponding to said power value. As shown in FIG. 1, the power sensing means 111 may be arranged in the proximity of the antenna 113 or at some other position in the transmitter link downstream of the first variable amplifier 109. The difference amplifier 112 compares the detector signal $U_{det}$ with the reference signal $U_{ref}$, therewith obtaining a difference signal $U_e$ by which is meant the difference between the value of the detector signal and the value of the reference signal. The obtained difference signal $U_e$ is utilized to control the amplification factor of both the first amplifier 109 and of the second amplifier 110. The amplification factors for respective variable amplifiers are controlled in a known manner.

A closed loop comprising the difference amplifier 112, the first variable amplifier 109, the power amplifier 120, the antenna 113 and the power sensing means 111 thus continues to perform a control function until the detector signal $U_{det}$ is equal to the reference signal $U_{ref}$. The radio base station sets the reference signal $U_{ref}$ to a maximum permitted value for the cell of the radio base station. Since there is always found for each cell at least one time slot that corresponds to maximum power output, the difference amplifier 112 will set the amplification of the first variable amplifier 109 so that the detector signal $U_{det}$ will be equal to the reference signal $U_{ref}$.

Radio frequency signals that are sent to and from the transmitter-and-receiver unit 107 via the feeder 117 will be subjected to attenuation during transportation in the feeder. Attenuation in the feeder 117 is, inter alia, dependent on the length of the feeder and its temperature.

It is highly important that a cellular system has a good power regulating capacity, partly to fulfil the requirements set by the authorities with respect to the highest permitted output power, and partly to obtain good spectrum efficiency, in other words determine cell size with the aid of different transmission powers so as to be able to reuse the same frequencies as soon as possible. This results in lower interference on other calls in the vicinity.

The power at which a mobile terminal shall transmit is determined in the Base Station Subsystem (BSS). BSS calculates the transmission power required by the mobile terminal, by measuring power received from the mobile terminal. In so doing, BSS takes into consideration the maximum transmission power of the mobile terminal and also quality measurements carried out by a base transceiver station (BTS).

The amplification (gain) is calibrated in conjunction with producing the radio unit 100, both with respect to the transmitter link and the receiver link in said unit. This also applies to the remote amplifier stage. Transmitter link amplification is the total amplification from the connection 116 on the transmitter-and-receiver unit 107 to an output of the duplex filter 114, via the remote transmitter amplifier unit 101. When the output power of a radio frequency signal from the transmitter-and-receiver unit 107 is designated Puts/$_M$, the attenuation in the feeder 117 is designated $A_F$, the amplification of the first variable amplifier 109 is designated $G_{tra}$ and the amplification of the power amplifier 120 is designated $G_T$, an output power $P_s$ to the antenna can be calculated in accordance with $$P_S = Puts_{S/M} \times \frac{1}{A_F} \times G_{tra} \times G_T,$$

where $$\frac{1}{A_F} \times G_{tra} \times G_T$$

is an amplification that is to be kept constant in the transmitter link. The output power Puts/$_M$ from the transmitter-and-receiver unit 107 is known. The amplification $G_T$ of the power amplifier 120 is known. Feeder attenuation $A_F$ varies greatly, with the degree of attenuation depending on the installation, for instance depending on the length of the feeder, and also with temperature. The amplification $G_{tra}$ of the first variable amplifier is controllable.

When the output power of the broadcast control channel BCCH is controlled so as to be held constant, a change in the amplification $G_A$ of the first variable amplifier will occur in response to a change in feeder attenuation $A_F$ due, for instance, to a change in temperature, such that the combined amplification for the feeder 117 and the first variable amplifier 109 will remain constant, i.e. the product of $$\frac{1}{A_F} \times G_{tra}$$

remains constant. When the feeder attenuation $A_F$ is doubled as a result of a temperature change for instance, the control circuit will regulate the amplification $G_{tra}$ of the first variable amplifier so as to double its amplification. The output power is therewith kept constant, despite this twofold increase in feeder attenuation $A_F$. The aforesaid difference signal $U_e$ is thus a measurement of feeder attenuation $A_F$, among other things.

The amplification of the receiver link is the total amplification from the antenna 113 to the connection 116 on the transmitter-and-receiver unit 107, via the remote receiver amplifier unit 104. When the power of a radio frequency signal received by the antenna 113 is designated P$_{mot/antenn}$, the amplification of the low noise amplifier 121 is designated $G_R$, the amplification of the second variable amplifier 110 is designated $G_{rec}$ and the feeder attenuation is designated $A_F$, the receiver power P$_{mot}$ at the connection 116 for a received radio frequency signal can be calculated in accordance with $$P_{mot} = P_{mot/antenn} \times G_R \times G_{rec} \times \frac{1}{A_F},$$

where $$G_R \times G_{rec} \times \frac{1}{A_F}$$

is an amplification that shall be kept constant in the receiver link.

Because the aforesaid difference signal $U_e$ is a measurement of the feeder attenuation $A_F$, the difference signal is also used to control the second variable amplifier 110. A change in feeder attenuation $A_F$ results in an amplification $G_R$ corresponding to the amplification of the second variable amplifier, such that the product of:

$$G_R \times G_{rec} \times \frac{1}{A_F}$$

remains constant.

The reference signal $U_{ref}$ can be varied in at least two ways. This will be described below with reference to FIG. 2 and FIG. 3. An inventive method of controlling the amplification for the first variable amplifier 109 and the second variable amplifier 110 will now be described with reference to FIG. 3. This inventive method of controlling the power will be explained with respect to a Time Division Multiple Access (TDMA) system of the GSM type. It will be understood, however, that the invention can also be applied in other mobile radio systems.

A mobile radio system constructed in accordance with TDMA technology has a number of frequencies, all of which are divided into a specific number of time slots. There are eight time slots for each frequency in the GSM system. Either control channels or traffic channels are sent from the radio base station and the mobile telephone in these time slots. Broadcast Control CHannel (BCCH) is a control channel that contains information important to the mobile terminals. The BCCH transmits from the radio base station to all mobiles that are located within the area covered by the radio base station. The BCCH transmits with the maximum power permitted for the cell, so as to be able to reach all mobiles present in the cell. All cellular radio systems include a channel that is transmitted at the highest possible power level and that functions to deliver information to all mobile stations. The channel is generally referred to as the broadcast channel, although it has its own specific designation in respect of our system.

Figure 2:
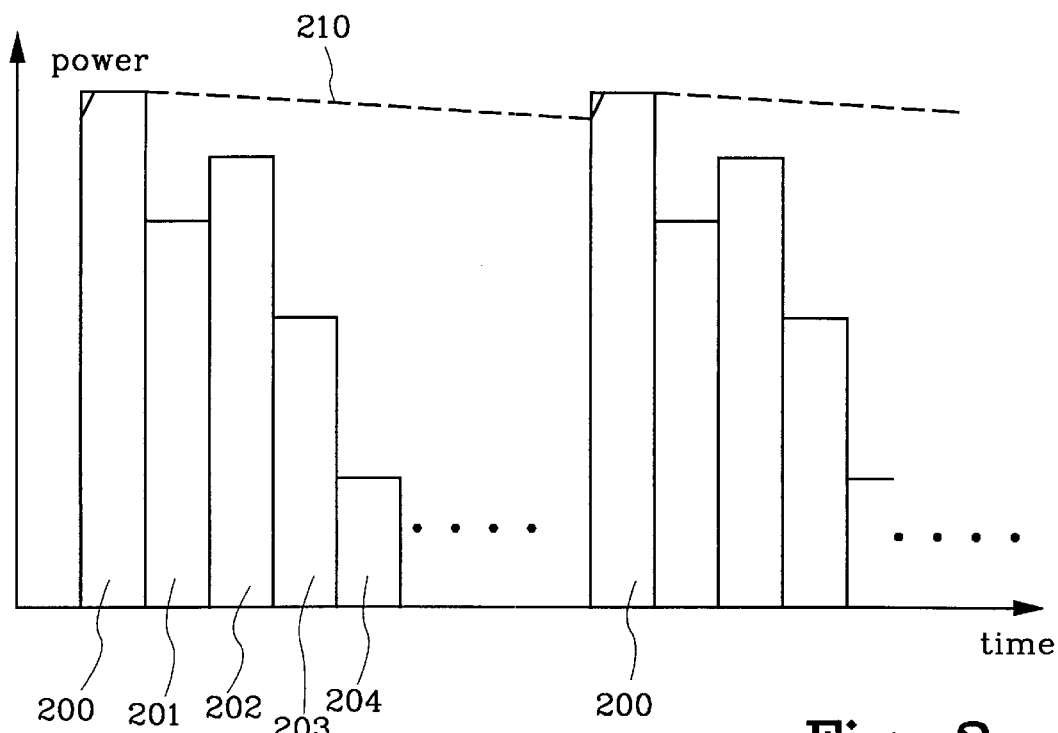
FIG. 2 shows the relationship between transmitted power and the set amplification level.

FIG. 2 is a time diagram which illustrates sequential transmission of time slots. A first time slot 200 corresponds to the control channel BCCH, while a second time slot 201, a third time slot 202, a fourth time slot 203 and a fifth time slot correspond to another signal, which may be either a traffic channel or a control channel.

The magnitude of the output power of the BCCH is set by suitable selection of the magnitude of the reference signal $U_{ref}$. In the case of this embodiment, it is only necessary to change the reference signal when needing to change the size of the cell.

The difference amplifier 112 is implemented with a peakhold detector that has a rapid rise time and a slow fall time. This is shown in FIG. 2 with a broken line 210, which corresponds to the amplification of the transmitter link. The transmitter link amplification decreases as a result of the difference amplifier 112 generating the difference signal $U_e$ which influences the amplification of the first variable amplifier 109. The slope of the broken line 210 has been greatly exaggerated, in order to make this principle clear. In this case, the difference signal $U_e$ occurs because the stored value of the measured detector signal $U_{det}$ decreases as a result of the known construction of the peakhold detector. When the first time slot 200 is sent, the amplification of the first variable amplifier 109 is set in the manner earlier explained. The output power of the BCCH is set in the transmitter part of the radio unit 100. The output power of the second time slot 201 is adjusted by the radio unit 100, amplified in the remote transmitter amplifier unit 101, and transmitted by means of the antenna 113. Because the difference amplifier 112 includes a peakhold detector, the regulating or control circuit will refrain from adjusting the second time slot to a level corresponding to the reference signal $U_{ref}$. The peakhold detector only takes the highest measurement signal into account. The difference amplifier 112 including said peakhold detector thus remembers the highest measured power.

As will be understood, the inventive method of controlling maximum output power is not restricted to measuring and controlling the output power of the BCCH. The same measuring and control processes can be carried out for any chosen signal and time slot that shall have a maximum output power.

Alternatively, the reference signal can be allowed to vary for each time slot, in which case power adjustment is effected by means of the regulating circuit in the antenna unit 119 for all time slots. In this embodiment, there is used a standard difference amplifier instead of a peakhold detector, said amplifier providing fast adjustment of the output power of each time slot. The transmitter part of the transmitter-and-receiver unit 107 contains information as to the magnitude of the power at which all time slots shall be transmitted. In this case, the reference signal $U_{ref}$ is generated in the transmitter part of the transmitter-and-receiver unit 107 and is delivered to the regulating or control circuit of the antenna unit 119 for each time slot. This is not shown in any of the Figures. However, a number of solutions are available in this respect. One example resides in a circuit that includes a memory store and a digital/analogue converter. The memory contains a table in which the various values correspond to a reference signal $U_{ref}$. In turn, the reference signal $U_{ref}$ corresponds to a given desired power output of radio frequency signals. The radio base station generates a digital value that points to a table value in the memory. The indicated value is digital/analogue converted, therewith obtaining the reference signal $U_{ref}$. A new reference signal is generated for each time slot.

Figure 3:
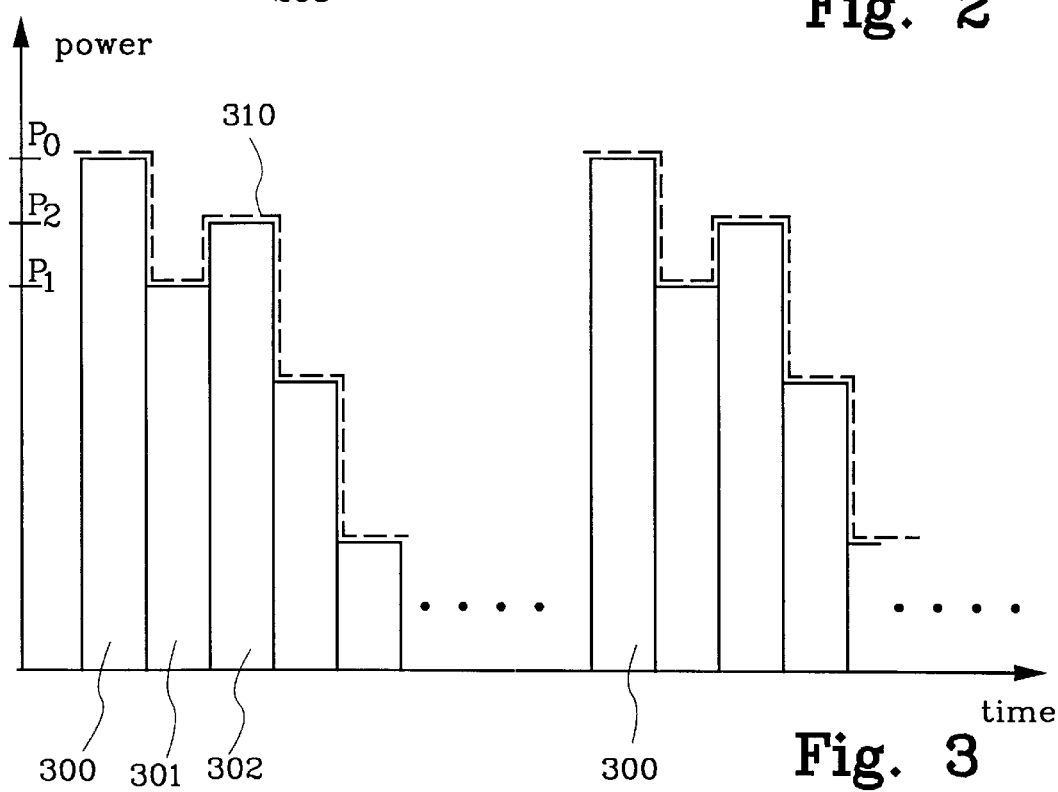
FIG. 3 shows how time slots with different power levels follow a reference signal corresponding to a specified power level.

The broken line 310 in FIG. 3 illustrates how the power for the transmitter link varies with transmitted time slots. This renders the output power independent of both temperature variations and frequency variations. This is because the output power of the transmitter-and-receiver unit 107 is changed at the same time as the reference signal $U_{ref}$ is changed. The reference voltage $U_{ref}$ is set to a power value $P_0$ corresponding to the power value for a first time slot 300, which may be a BCCH, for instance. When a second time slot is to be transmitted with a lower output power, the reference signal $U_{ref}$ is changed to a lower value corresponding to the output power $P_1$. The output power from the transmitter-and-receiver unit 107 is changed at the same time. When a third time slot 302 having an output power $P_2$ is to be transmitted, the reference voltage $U_{ref}$ is set to a value corresponding to the power $P_2$. The power sensing means 111 measures the power of the radio frequency signal of each time slot and generates a detector signal $U_{det}$ that corresponds to each power. The output power adjustment continues in this way for all time slots sent from the radio unit 100.

Figure 4:
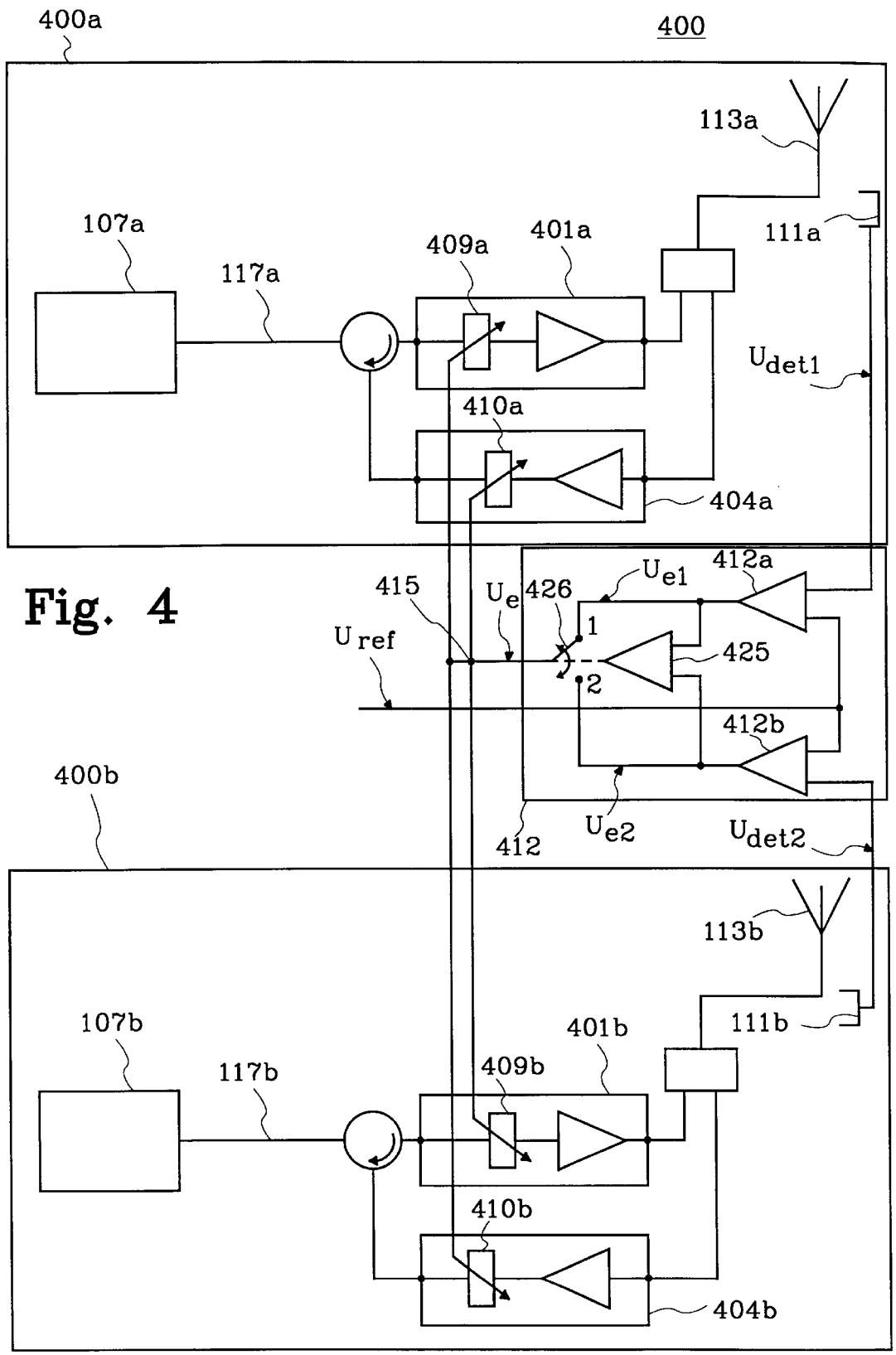
FIG. 4 shows another embodiment of the inventive radio unit with two essentially identical radio units.

A radio unit that has a higher transmitting-and-receiving capacity than the radio unit 100 described with reference to FIG. 1 is obtained by combining two identical communication units 400a, 400b such as to provide a radio unit 400. FIG. 4 illustrates such a higher capacity radio unit 400. The communication units 400a, 400b are essentially comprised of the same components as the radio unit 100. The radio unit 100 was described above with reference to FIG. 1. In this embodiment, however, there is obtained on the one hand a first detector signal $U_{det1}$ that corresponds to the power of a radio frequency signal sent from a first antenna 113a, the power of said radio signal being converted by means of a first power sensing means 111a to said first detector signal, and, on the other hand, a second detector signal $U_{det2}$ that corresponds to the power of the radio frequency signal sent from a second antenna 113b, the power of said radio signal being converted by means of a second power sensing means 111b. It is intended with this embodiment to utilize the reference signal $U_{ref}$ to control the system so that the output powers of the radio signals sent respectively from the first antenna 113a and from the second antenna 113b will not exceed the maximum permitted power.

The radio unit 400 also includes a first peakhold detector 412a with amplification and a second peakhold detector 412b with amplification, said detectors each generating a respective first difference signal $U_{e1}$ and a second difference signal $U_{e2}$. The first difference signal $U_{e1}$ is obtained from the first peakhold detector 412a by comparison of the first detector signal $U_{det1}$ with the reference signal $U_{ref}$. The second difference signal $U_{e2}$ is obtained from the second peakhold detector 412b by comparing the second detector signal $U_{det2}$ with the reference signal $U_{ref}$. The first difference signal $U_{e1}$ is compared with the second difference signal $U_{e2}$ with the aid of a comparator 425 which generates an output signal that moves a switch 426 either to a first state 1 or to a second state 2. The peakhold detectors 412a, 412b, the comparator 425 and the switch 426 form a difference amplifier 412. If the first difference signal $U_{e1}$ has the highest value, the switch 426 is switched to its first state 1, whereas if the second difference signal $U_{e2}$ has the highest value, the switch 426 is switched to its second state 2. The first difference signal corresponds to the detector signal of highest value. The greatest difference signal of the first difference signal $U_{e1}$ and the second difference signal $U_{e2}$ is chosen by means of the comparator 425 as before mentioned, and thus corresponds to the difference signal $U_e$ present on the output 425 of the difference amplifier 412 in FIG. 4.

The obtained difference signal $U_e$ is used to adjust a first variable amplifier 409a, a second variable amplifier 409b, a third variable amplifier 410a, and a fourth variable amplifier 410b. With a common setting of the variable amplification in a first remote transmitter amplifier unit 401a and a second remote transmitter amplifier unit 401b, the first remote transmitter amplifier unit 401*a* and the second remote transmitter amplifier unit 401*b* will therewith have the same high amplification. Because the remaining components of respective communication units for 400*a*, 400*b* are essentially identical, the same amplification will be obtained in the transmitter links of respective communications units 400*a*, 400*b*. The same applies to the receiver link of respective communications units 400*a*, 400*b*. In other words, when the variable amplification in a first remote receiver amplifier unit 404*a* and in a second remote receiver amplifier unit 404*b* have a common setting, the same amplification factor will be obtained for the first remote receiver amplifier unit 404*a* and for the second remote receiver amplifier unit 404*b*. Knowledge that one of the two units 400*a*, 400*b* transmits a radio frequency signal with a maximum permitted output power enables the amplification of the transmitter link and the receiver link of the communications units 400*a*, 400*b* to be adjusted. As before mentioned, the signal that is sent with maximum power may be the broadcast control channel BCCH in a GSM system, for instance.

Figure 5:
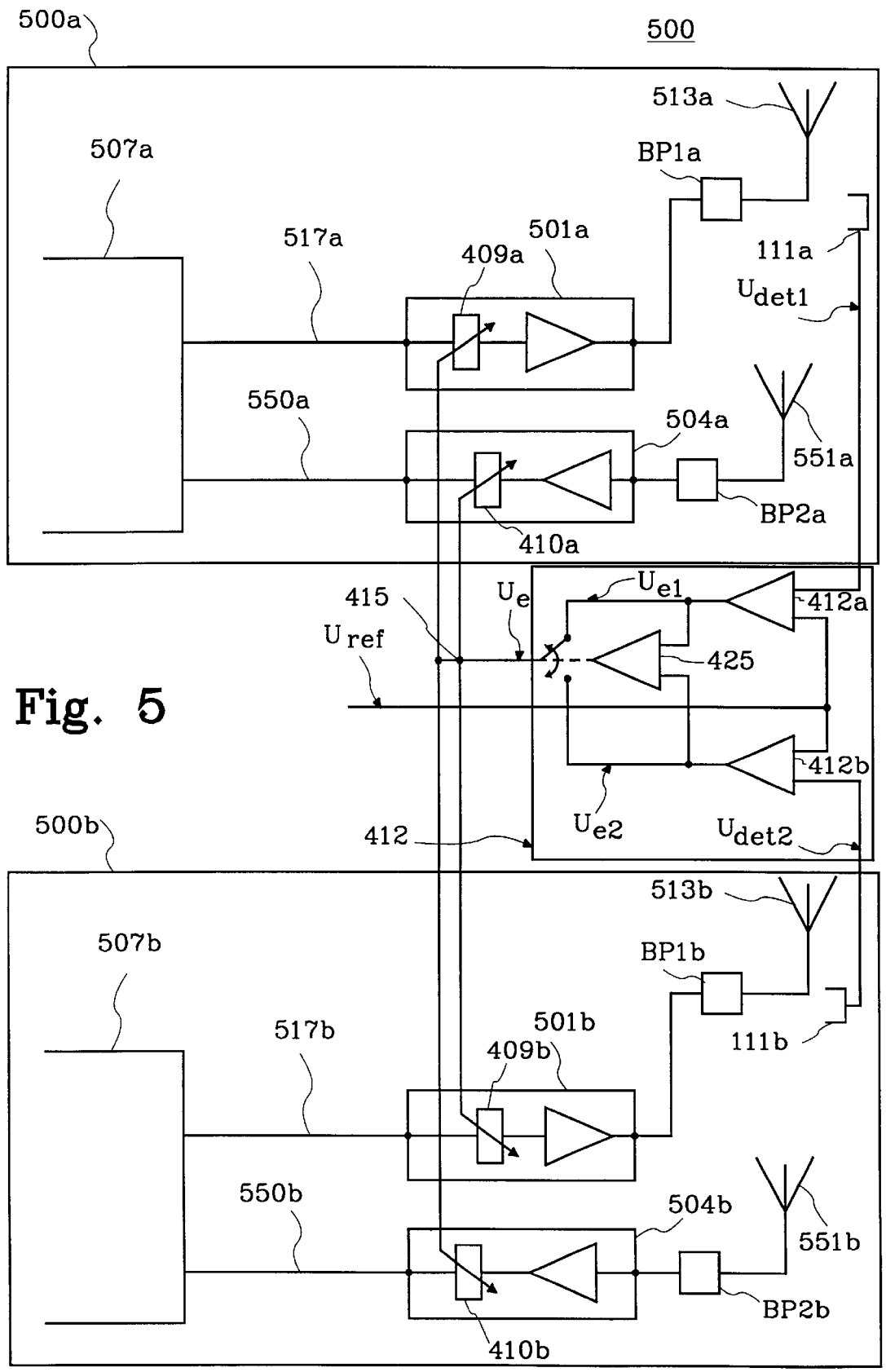
FIG. 5 shows another embodiment of the inventive radio unit.

FIG. 5 shows another embodiment of an inventive radio unit 500. The radio unit 500 includes two essentially identical communications units 500*a*, 500*b*. The embodiment illustrated in FIG. 5 differs from the FIG. 4 embodiment in that a first feeder 517*a* is connected between the transmitter-and-receiver unit 507*a* and the first remote transmitter amplifier unit 401*a*, a second feeder 550*a* is connected between the transmitter-and-receiver unit 507*a* and the first remote receiver amplifier unit 504*a*, a third feeder 517*b* is connected between the transmitter-and-receiver unit 507*b* and the second remote transmitter amplifier unit 401*b*, and a fourth feeder 550*b* is connected between the transmitter-and-receiver unit 507*b* and the second remote transmitter amplifier unit 401*b*.

Another difference resides in the use of separate transmitter-and-receiver antennas for each communications unit. The first remote transmitter amplifier unit 401*a* is connected to a first transmitter antenna 513*a* via a first bandpass filter BP1*a*, while the first remote receiver amplifier unit 504*a* is connected to a first receiver antenna 551*a* via a second bandpass filter. The communications unit 500*b* is constructed correspondingly, that is to say the second remote transmitter amplifier unit 501*b* is connected to a second transmitter unit 513*b* via a third bandpass filter BP1*b*, while the second-remote receiver amplifier unit 504*b* is connected to a second receiver unit 551*b* via a fourth bandpass filter BP2*b*.

Power control is effected in the radio unit according to FIG. 5 in the same way as that of the aforedescribed inventive radio unit 400 illustrated in FIG. 4.

In a further embodiment of an inventive radio unit that includes more than one communications unit 600*a*, 600*b*, compensation is made for possible variation of the attenuation between the feeders 117*a*, 117*b* of respective units 600*a*, 600*b*. This further embodiment is described with reference to FIG. 6. The radio unit 600 includes two communications units 600*a*, 600*b*, similar to the radio unit described above with reference to FIG. 4. Each of the communications units 600*a*, 600*b* differs slightly from the units shown in FIG. 1 and FIG. 4, in that the variable amplifier 609*a*, 609*b* of the remote transmitter stage is connected between the feeder 117*a*, 117*b* and the circulator. This placement makes the variable amplifier 609*a*, 609*b* common to both the remote transmitter amplifier unit and the remote receiver amplifier unit.

As with the earlier described embodiments, each remote transmitter amplifier unit includes a remote power amplifier 620*a*, 620*b*, in addition to the variable amplifier 609*a*, 609*b*. Each remote receiver amplifier unit includes a receiver amplifier 621*a*, 621*b* in addition to the variable amplifier 609*a*, 609*b*. The receiver amplifier 621*a*, 621*b* and the power amplifier 620*a*, 620*b* are connected in parallel between the circulator and a duplex filter. The duplex filter is connected to the antenna 113*a*, 113*b*.

Each communications unit 600*a*, 600*b* includes a power sensing means 111*a*, 111*b* and a separate difference amplifier 612*a*, 612*b*. The difference amplifier 612*a*, 612*b* receives on one input the measured power level from the power sensing means 111*a*, 111*b* and on another input a reference signal $U_{ref}$. The output of difference amplifier 612*a*, 612*b* is connected to the variable amplifier 609*a*, 609*b* and controls its amplification through the medium of a difference signal $U_{e1}$, $U_{e2}$.

The radio unit 600 also includes a control unit 630 having connections 631, 632*a*, 632*b*, as described below.

Thus, each communications units 600*a*, 600*b* of this embodiment has its own power level control system which works independently of the other communications units 600*a*, 600*b*.

Only BCCH is always transmitted on maximum power and only one communications unit 600*a*, 600*b* at time can send BCCH. Thus, with separate power regulating loops, only one communications unit 600*a*, 600*b* at a time is able to set the level of the difference amplifier 612*a*, 612*b* with the aid of BCCH. Since channels other than BCCH also sometimes transmit above maximum power, the difference amplifier is also able to adjust to the correct level when one of these other channels is transmitted on maximum power.

One way of guaranteeing that maximum power will be constantly transmitted over one channel from each communications unit 600*a*, 600*b*, is to move the transmission of BCCH between the two communications units 600*a*, 600*b*. In this case, one communications unit 600*a*, 600*b* will transmit on BCCH over a short period and sets the correct power level and can then wait for at least some minutes before needing to reset the power level. BCCH is then again moved and the radio power output set to the correct power level.

This presumes that the difference amplifier 612*a*, 612*b* retains the level of the difference signal $U_{e1}$, $U_{e2}$ between those periods at which transmission is at maximum radio power. The difference amplifier may include the earlier described peakhold detector 412*a*, 412*b* when it has a very slow fall time. Alternatively, the difference amplifier may have a digital memory function that holds the output signal constant on the level set at the latest transmission on maximum power output.

Attenuation variations in the feeder are normally slow and the control loop that compensates for this attenuation may also be slow.

Figure 7:
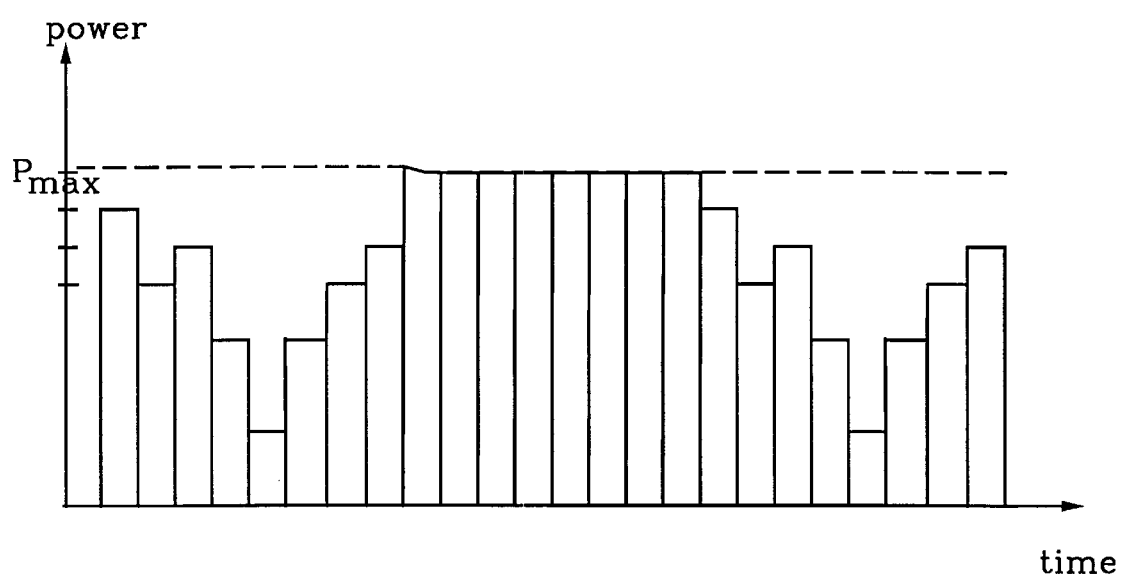
FIG. 7 illustrates temporary control of output powers to highest levels for some time slots.

An alternative solution is to increase the transmission power to a maximum permitted level over a short sequence for one or more time slots and thereby update the level from the difference amplifier 612*a*, 612*b*. This interval may be made a long interval, for instance an interval of ten minutes or thereabove, between the short sequences of maximum power transmission. The principle of this solution is shown in FIG. 7, in which the difference signal $U_{e1}$, $U_{e2}$ delivered by the difference amplifier 612*a*, 612*b* is indicated by a broken line, which corresponds to the amplification from the difference amplifier 612*a*, 612*b*. It is assumed in this case that the difference signal $U_{e1}$, $U_{e2}$ from the difference amplifier 612*a*, 612*b* is held at a constant level between updates with the aid of a digital memory circuit. When the power output is raised temporarily to a maximum level in this case, the difference signal $U_{e1}$, $U_{e2}$ delivered by the difference amplifier 612a, 612b will be lowered slightly, as indicated by the broken line in FIG. 7.

Instead of allowing the difference amplifier to maintain the level of the difference signal $U_{e1}$, $U_{e2}$ over a long time period, the communications unit 600a, 600b can be switched quickly for transmission of BCCH. This switch can be made for each time slot, for instance.

Figure 6:
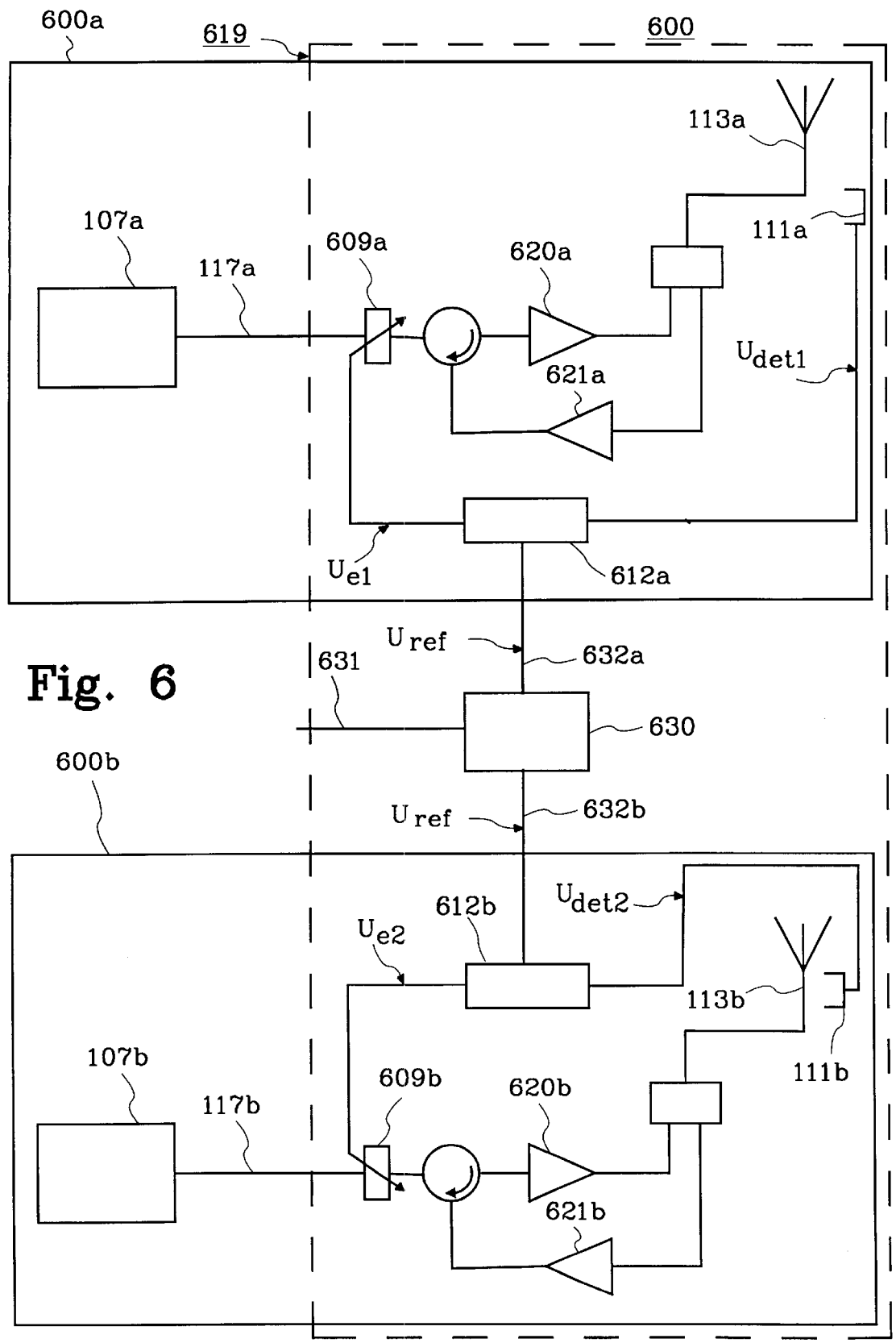
FIG. 6 shows yet another embodiment of the inventive radio unit.

The radio unit 600 shown in FIG. 6 includes all components from the end of the two feeders 117a, 117b up to and including the antennas 113a, 113b in the antenna unit 619. The antenna unit 619 also includes a control unit 630. The control unit 630 is connected to a supervisory unit located adjacent the transmitter-and-receiver unit 107, via a data bus 631. The supervisory unit is not shown in FIG. 6. The level or levels of the reference signal $U_{ref}$ is/are set in the radio unit 600 with the aid of the supervisory unit. The control unit is also connected to the two difference amplifiers 612a, 612b by data busses. The level of the reference signal $U_{ref}$ is sent to the control unit 630 in the antenna unit 619 from the supervisory unit. The control unit supplies the difference amplifiers 612a, 612b with the reference voltage $U_{ref}$ via the data busses 632a, 6332b. The reference voltage $U_{ref}$ is given as a digital value and is D/A converted by respective difference amplifiers 612a, 612b.

When a power adjustment is made for each transmitted time slot, as earlier described with reference to FIG. 3, the control unit 630 changes the level of the transmitted reference signal $U_{ref}$ for each time slot and each difference amplifier 612a, 612b.

The data busses 632a, 632b that connect the control unit 630 with the difference amplifier 612a, 612b are two-directional. The control unit 630 reads the detector voltage $U_{det}$ received by each difference amplifier 621a, 621b through the power sensing means 111a, 111b. If the received detector voltage $U_{det}$ is excessively low, the control unit 630 reports this to the supervisory unit.

Any malfunctioning of the link feeder 117a, 117b, remote power amplifier or antenna 113, 113b with respective connections will be discovered by this difference report.

Naturally, more than two radio units can be combined into a single radio unit, so as to obtain still greater capacity. Amplification in the transmitter link and the receiver link of each communications unit (400a, 400b, 600a, 600b) in a radio unit that is comprised of more than two communications units is controlled and adjusted in the same way as that explained with reference to FIG. 4 and FIG. 6. BCCH transmissions can also be controlled to alternate between more than two radio units.

A number of known radio base stations include an antenna which is common both to uplink and downlink, whereas other known radio base stations include separate uplink and downlink antennas. The present invention can be applied with both of these variants and, for instance, the radio unit in FIG. 1 may be provided with an antenna for uplink and an antenna for downlink.

In this presentation, it has been assumed for the sake of simplicity that the antenna unit 119 is placed at the top of a mast, as distinct from the transmitter-and-receiver unit 107. The transmitter-and-receiver unit 107 is normally placed at the foot of the mast and the antenna unit 119 high up on the mast. However, several variations exist with respect to the placement of the antenna and transmitter-and-receiver unit. One example in this respect is an indoor cell where the transmitter-and-receiver unit 107 must be placed at a position different to the antenna unit 119, for aesthetic reasons or space reasons.

It will be understood that the invention is not restricted to the described and illustrated embodiments thereof and that modifications can be made with the scope of the following claims.

What is claimed is:

1. A radio unit for communication with radio terminals comprising:

at least one remote transmitter amplifier unit having an input and an output, wherein the input of the transmitter amplifier unit is connected to a transmitter-and-receiver unit in the radio unit by a feeder having time-varying attenuation, wherein the output of the transmitter amplifier unit is connected to an antenna unit, wherein the transmitter amplifier unit includes a first variable amplifier;

a second variable amplifier having an input and an output, wherein the output of the second variable amplifier is connected to said transmitter-and-receiver unit via said feeder, and wherein the input of the second variable amplifier is connected to said antenna unit;

at least one sensor means for generating a detector signal corresponding to the signal output power of said antenna unit;

a difference amplifier for comparing said detector signal with a reference signal corresponding to a desired signal output power, wherein a difference signal is obtained on an output of the difference amplifier, and wherein the output of the difference amplifier is connected at least to said first variable amplifier, and wherein said difference signal is used to control said first variable amplifier to compensate for said varying attenuation in the feeder; and at least one remote receiver amplifier unit having an input and an output, wherein the input of the receiver amplifier unit is connected to said antenna unit, wherein the output of the receiver amplifier unit is connected to the transmitter-and-receiver unit in the radio unit via said feeder, wherein said receiver amplifier unit includes said second variable amplifier, and wherein said difference signal controls the second variable amplifier to compensate for said varying attenuation in said feeder.

2. A radio unit according to claim 1, wherein said reference signal is set at a predetermined time point that corresponds to a time point at which the output power shall be changed.

3. A radio unit according to claim 2 wherein said predetermined time point corresponds to a time point when the size of a cell in which the radio unit communicates with radio terminals shall be changed.

4. A radio unit according to claim 2, wherein said predetermined time point is the commencement of a time slot in a TDMA frame.

5. A radio unit according to claim 1, wherein said difference amplifier includes at least one peakhold detector.

6. A radio unit according to claim 1, wherein the radio unit's output power increases to a maximum level over a time interval of short duration to update said difference signal.

7. A radio unit for communication with radio terminals comprising:

at least one remote transmitter amplifier unit having an input and an output, wherein the input of the transmitter amplifier unit is connected to a transmitter-and-receiver unit in the radio unit by a feeder having time-varying attenuation, wherein the output of the transmitter amplifier unit is connected to an antenna unit, wherein the transmitter amplifier unit includes a first variable amplifier;

a second variable amplifier having an input and an output, wherein the output of the second variable amplifier is connected to said transmitter-and-receiver unit via said feeder, and wherein the input of the second variable amplifier is connected to said antenna unit;

at least one sensor means for generating a detector signal corresponding to the signal output power of said antenna unit;

a difference amplifier for comparing said detector signal with a reference signal corresponding to a desired signal output power, wherein a difference signal is obtained on an output of the difference amplifier, and wherein the output of the difference amplifier is connected at least to said first variable amplifier, and wherein said difference signal is used to control said first variable amplifier to compensate for said varying attenuation in the feeder; and at least one remote receiver amplifier unit having an input and an output, wherein the antenna unit includes a first and second antenna, wherein the output of the at least one transmitter amplifier unit is connected to said first antenna, wherein the input of the receiver amplifier unit is connected to said second antenna, wherein the output of the receiver amplifier unit is connected to said transmitter-and-receiver unit in the radio unit via said feeder, wherein said receiver amplifier unit includes said second variable amplifier, and wherein said difference signal controls the second variable amplifier to compensate for said varying attenuation in the feeder.

8. A radio unit according to claim 7, wherein said reference signal is set at a predetermined time point that corresponds to a time point at which the output power shall be changed.

9. A radio unit according to claim 8, wherein said predetermined time point corresponds to a time point when the size of a cell in which the radio unit communicates with radio terminals shall be changed.

10.. A radio unit according to claim 8, wherein said predetermined time point is the commencement of a time slot in a TDMA frame.

11. A radio unit according to claim 7, wherein said difference amplifier includes at least one peakhold detector.

12. A radio unit according to claim 7, wherein the radio unit's output power increases to a maximum level over a time interval of short duration to update said difference signal.

13. A radio unit, for communication with radio terminals, comprising:

a first and a second communications unit, each of which includes a respective antenna, wherein the first communications unit includes a first sensing means and the second communications unit includes a second sensing means;

said first and said second sensing means each being adapted to generate a respective detector signal corresponding to the power output of its own antenna;

wherein the first communications unit also includes a first remote transmitter amplifier unit and said second communications unit also includes a second remote transmitter amplifier unit, each of said amplifier units having an input and an output, wherein the input is connected to a respective transmitter-receiver unit in said radio unit via a respective feeder having an attenuation that varies in time, and wherein said output is connected to its respective antenna, and wherein said first and said second transmitter amplifier units, each includes a respective variable amplifier; and a difference amplifier having an input from said first sensing means, an input from said second sensing means, wherein the difference amplifier is adapted to compare said detector signal from said first and said second sensing means with a reference signal that corresponds to a desired output power, and wherein a difference signal is obtained on an output of the difference amplifier, wherein the output of the difference amplifier is connected to each of said variable amplifiers of said communications units, and the difference signal is used to control said variable amplifiers to compensate for said varying attenuation in respective feeders.

14. A radio unit according to claim 13, wherein each of said communications units includes a remote receiver amplifier unit connected between said antenna and said feeder and, in turn, includes a second variable amplifier, wherein said difference signal is used to control the second variable amplifier to compensate for said varying attenuation in the feeder.

15. A radio unit according to claim 13, wherein each communications unit includes a second antenna, a remote receiver amplifier unit having an input from said other antenna and connected to said transmitter-receiver unit via a second feeder, wherein the receiver amplifier unit includes a second variable amplifier, and wherein said difference signal is used to control the second variable amplifier to compensate for said varying attenuation in the feeder.

16. A radio unit according to claim 13, wherein said difference amplifier comprises:

a first and a second peakhold detector, wherein said first peakhold detector is adapted to compare the detector signal from said first sensing means with said reference signal to obtain a first difference signal, and wherein the second peakhold detector is adapted to compare the detector signal from said second sensing means with said reference signal to obtain a second difference signal; and a comparator for delivering to said variable amplifiers that difference signal which corresponds to the detector signal that has the greatest importance.

17. A radio unit according to claim 16, wherein said difference amplifier includes at least one switch, wherein said switch is controlled by the output signal of said comparator to connect an output of said peakhold detectors to the output of the difference amplifier.

18. A radio unit comprising:

at least two communications units, wherein each communication unit comprises:
a power amplifier in series with a variable amplifier;
a transmitter-and-receiver unit;
a feeder having a time-varying attenuation; and
an antenna, wherein said power amplifier and said variable amplifier are disposed between said antenna and said transmitter-and-receiver unit via said feeder;

a sensing means which is adapted to generate a detector signal corresponding to the output power of said antenna;

a difference amplifier for comparing said detector signal with a reference signal that corresponds to a desired power output, and wherein a difference signal is obtained on the output of the difference amplifier, wherein the output of the difference amplifier is connected to the variable amplifier, and said difference signal is used to control said variable amplifier to compensate for said varying attenuation in the feeder;

a supervisory unit located adjacent said transmitter-receiver units; and an antenna unit including a control unit connected to each difference amplifier and to the transmitter-receiver unit.

19. A radio unit according to claim 18, wherein each of said communications units includes a receiver amplifier in series with said variable amplifier, wherein said receiver amplifier has an input which is connected to said antenna and an output which is connected to said transmitter-and-receiver unit via said feeder.

20. A radio unit according to claim 18, where the radio unit allows the first and the second communications units to transmit a broadcast channel alternately.

21. A radio unit according to claim 18, wherein the radio unit is constructed to raise the radio power output to a maximum level over a time interval of short duration to update at least one of said first and said second difference signals.

22. A radio unit according to claim 18, wherein said difference amplifier includes a peakhold detector.

23. A radio unit according to claim 18, wherein said control unit is adapted to read the level of said detector signal and to send an alarm signal to the supervisory unit depending on said level.

24. A radio unit comprising:

a transmitter-and-receiver unit;

an antenna unit; and a feeder with a time-varying attenuation, wherein the feeder connects the transmitter-and-receiver unit to the antenna unit, via a circulator;

the antenna unit comprising:

an antenna connected to a remote transmitter amplifier unit, via a duplex filter, wherein the remote transmitter amplifier unit comprises a variable amplifier and a power amplifier used to compensate for the time-varying attenuation in the feeder;

a control circuit, the control circuit comprising;

a sensor means for generating a detector signal corresponding to a signal output power of the antenna; and a difference amplifier for comparing the detector signal with a reference signal corresponding to a desired signal output power, wherein the difference amplifier generates a difference signal for use by the variable amplifier of the remote transmitter amplifier unit; and a remote receiver amplifier unit connected to the antenna, via the duplex filter, and the feeder, via the circulator, wherein the remote receiver amplifier unit comprises a second variable amplifier and a second power amplifier used to compensate for the time-varying attenuation in the feeder, and wherein the difference signal generated from the difference amplifier in the antenna unit is connected to the second variable amplifier of the remote receiver amplifier unit.

25. A radio unit according to claim 24, wherein the reference signal is set at a predetermined time point that corresponds to a time point at which the output power shall be changed.

* * * * *